(12) United States Patent
Kodera et al.

(10) Patent No.: US 9,442,364 B2
(45) Date of Patent: Sep. 13, 2016

(54) MASK BLANK FOR REFLECTION-TYPE EXPOSURE, AND MASK FOR REFLECTION-TYPE EXPOSURE

(71) Applicant: TOPPAN PRINTING CO., LTD., Tokyo (JP)

(72) Inventors: Yutaka Kodera, Tokyo (JP); Yo Sakata, Tokyo (JP); Masato Kon, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 246 days.

(21) Appl. No.: 14/221,994

(22) Filed: Mar. 21, 2014

(65) Prior Publication Data

US 2014/0205936 A1    Jul. 24, 2014

Related U.S. Application Data

(63) Continuation of application No. PCT/JP2012/006054, filed on Sep. 24, 2012.

(30) Foreign Application Priority Data

Sep. 28, 2011 (JP) ................. 2011-212635
Oct. 25, 2011 (JP) ................. 2011-233553

(51) Int. Cl.
*G03F 1/24* (2012.01)
*G03F 1/40* (2012.01)
*G03F 1/60* (2012.01)

(52) U.S. Cl.
CPC . *G03F 1/24* (2013.01); *G03F 1/40* (2013.01); *G03F 1/60* (2013.01)

(58) Field of Classification Search
CPC ........................................................ G03F 1/24
See application file for complete search history.

(56) References Cited

U.S. PATENT DOCUMENTS

| | | | |
|---|---|---|---|
| 6,391,499 B1 * | 5/2002 | Kim | G03F 1/54 430/5 |
| 2007/0160916 A1 | 7/2007 | Ikuta et al. | |
| 2010/0167187 A1 | 7/2010 | Ikuta et al. | |

FOREIGN PATENT DOCUMENTS

| | | |
|---|---|---|
| JP | 2001-328827 | 11/2001 |
| JP | 2007-273651 | 10/2007 |
| JP | 2009-523311 | 6/2009 |
| JP | 2011-44520 | 3/2011 |

OTHER PUBLICATIONS

Korean Office Action dated Apr. 29, 2015 in corresponding Korean Patent Application No. 10-2014-7007476.
International Search Report mailed Oct. 23, 2012 in corresponding International Patent Application No. PCT/JP2012/006054.

* cited by examiner

*Primary Examiner* — Stephen Rosasco

(57) ABSTRACT

A reflective exposure mask blank and a reflective exposure mask are provided, and the mask enables accurate exposure and transcription without having light being reflected from areas other than a circuit pattern area. The reflective mask blank has, on a substrate (11), a multilayer reflective film (12), a protective film (13), an absorption film (14), and a reverse-surface conductive film (15). A reverse-surface conductive film is formed from indium tin oxide. The substrate contains $SiO_2$, $TiO_2$, and at least one oxide of manganese (Mn), copper (Cu), cobalt (Co), chromium (Cr), iron (Fe), silver (Ag), nickel (Ni), sulfur (S), selenium (Se), gold (Au), and neodymium (Nd). The reflective mask is manufactured by forming a circuit pattern by selectively stripping the absorption film on the reflective mask blank, and forming a light-shielding frame by stripping the multilayer reflective film, the protective film, and the absorption film around the circuit pattern.

3 Claims, 9 Drawing Sheets

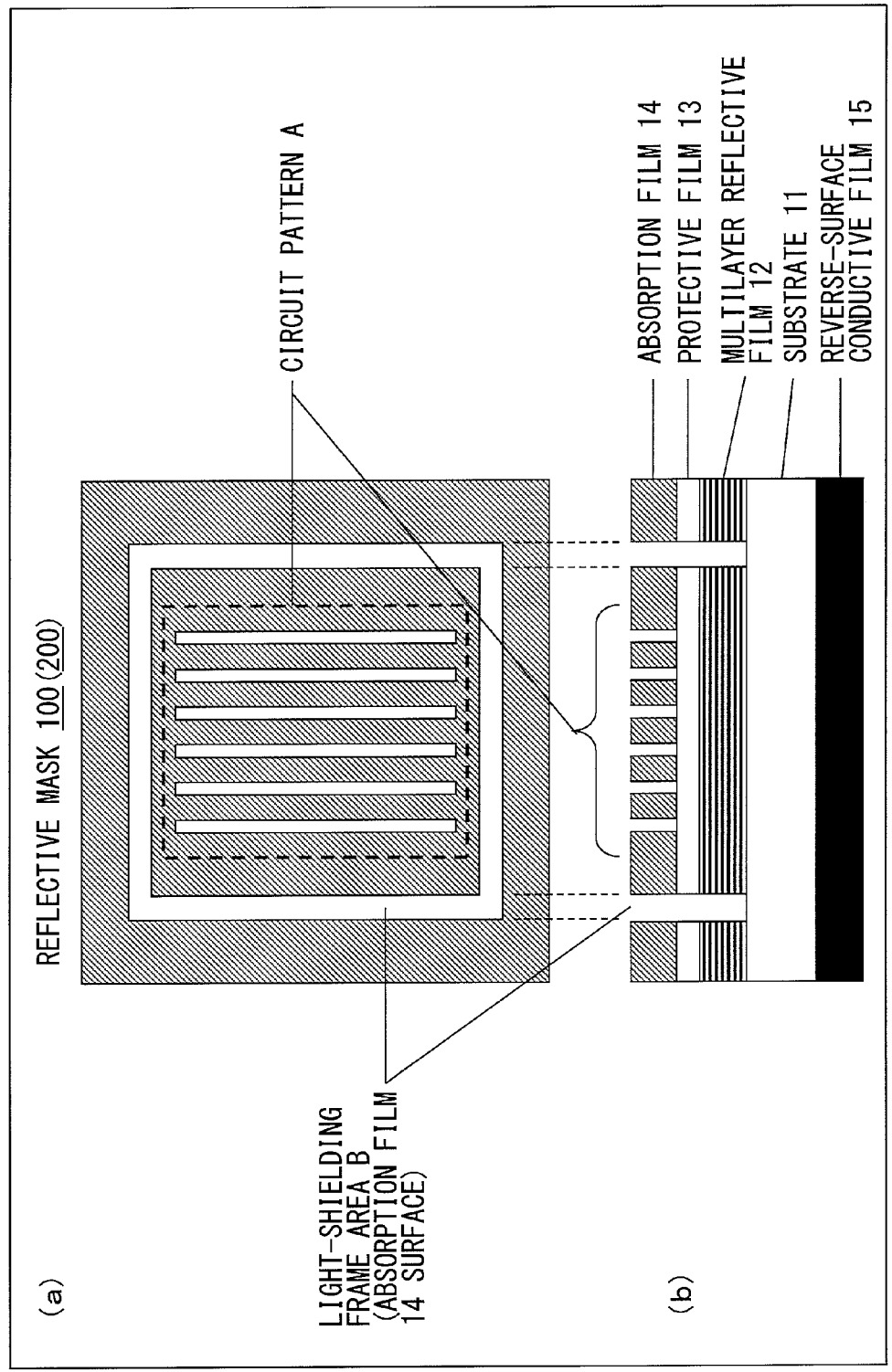
F I G. 2

MASK BLANK FOR REFLECTION-TYPE EXPOSURE, AND MASK FOR REFLECTION-TYPE EXPOSURE

CROSS-REFERENCE TO RELATED APPLICATIONS

This application is a continuation application of PCT/JP2012/006054 filed Sep. 24, 2012 and claims foreign priority benefit of Japanese Applications No. 2011-212635 filed Sep. 28, 2011 and No. 2011-233553 filed Oct. 25, 2011 in the Japanese Intellectual Property Office, the contents of which are incorporated herein by reference.

TECHNICAL FIELD

The present invention relates to a mask for reflection-type exposure.

BACKGROUND ART

In the manufacturing process of semiconductor devices, associated with miniaturization of semiconductor devices, the demand of miniaturization has increased for photolithography technique. As a part of realizing miniaturization with photolithography technique, replacement is already being made in the exposure method of lithography, from exposure using conventional ArF excimer laser light having a wavelength of 193 nm to exposure using light in the EUV (Extreme Ultra Violet) range with a wavelength of 13.5 nm. Since most substances have high light absorption property with respect to light in the EUV range, a hitherto known transmission type mask cannot be used as a mask for EUV exposure, and a reflection type mask is used as a mask for EUV exposure (EUV mask) (e.g., cf. Patent Literature 1). Patent Literature 1 discloses a technology of forming a light reflection film consisting of a multilayer film by alternately laminating molybdenum (Mo) layers and silicon (Si) layers on a glass substrate, and forming thereon a pattern with a light absorption body whose main component is tantalum (Ta).

In addition, since a dioptric system that utilizes transmission of light cannot be used for EUV light as described above, the optical system of an exposure machine will be a reflection type. Therefore, deflection utilizing a transmissive beam splitter is not possible. Thus, the reflective mask has a disadvantage of being unable to design incident light to the mask and reflected light therefrom to be on the same axis. Therefore, in an EUV mask, a technique is adopted in which reflected light of light, which had entered the mask and whose optical axis is tilted by about 6 degrees, is guided to a semiconductor substrate. In this technique, since the optical axis is tilted, a problem referred to as projection effect occurs in which the line width of the wiring pattern of a mask on a semiconductor substrate becomes different from that of a mask pattern, depending on the light incident direction with respect to the mask pattern. Therefore, for the purpose of suppressing or lessening the projection effect, it has been proposed to reduce the film thickness of an absorption film forming the mask pattern.

With the technique of reducing thickness of a light absorption film, since light attenuation amount that is required for absorbing EUV light becomes insufficient, light reflected to the semiconductor substrate increases, and a problem of sensitizing a resist film applied on the semiconductor substrate occurs. In addition, since exposure occurs on multiple faces on a chip on the semiconductor substrate, multiple exposures occur at boundary areas of adjacent chips. Furthermore, an EUV light source has a radiation spectrum having a peak at 13.5 nm, but is also known to radiate light other than that in the 13.5 nm band referred to as Out of Band, from vacuum ultraviolet ray to near-infrared light range. Since Out of Band is fundamentally unnecessary and sensitizes resist applied on the semiconductor substrate, Out of Band is unnecessary light that should be removed with a filter or the like.

However, a light absorption film using tantalum (Ta) also reflects light in a range from vacuum ultraviolet ray to deep ultra violet and near-infrared light range. Therefore, as described above, an unignorable amount of light accumulates on a semiconductor wiring part in the vicinity of the boundary area of adjacent chips, and causes a problem of affecting the dimension of the wiring pattern.

Proposed in response to this problem is a mask structure including a light-shielding frame (light-shielding band) where a surface quartz which is a base material is exposed by stripping, after stripping an absorption layer forming a pattern, a multilayer reflective film that contributes in reflecting EUV light to reduce reflected light at a chip boundary through means such as etching (cf. Patent Literature 2). However, Out of Band light has a problem of passing through quartz which is the base material, being reflected at a reverse-surface conductive film such as chromium nitride (CrN) formed on a surface opposite of the pattern side of the EUV mask, passing through the quartz again to be radiated to the semiconductor substrate side, and sensitizing the resist applied on the semiconductor substrate.

CITATION LIST

Patent Literature

[PTL 1] Japanese Laid-Open Patent Publication No 2007-273651
[PTL 2] Japanese Laid-Open Patent Publication No 2011-044520

SUMMARY OF THE INVENTION

Problems to be Solved by the Invention

The present invention has been made in order to solve the above described problem, and an objective of the present invention is to provide a reflective mask whose reflection is reduced for light of EUV and ultraviolet range to near-infrared light range at a mask area corresponding to a boundary area of chips that are exposed multiple times on a semiconductor substrate.

Solution to the Problems

The present invention is a reflective mask blank including: a substrate; a multilayer reflective film formed on the substrate and configured to reflect exposure light; a protective film formed on the multilayer reflective film and configured to protect the multilayer reflective film; an absorption film formed on the protective film and configured to absorb exposure light; and a conductive film formed on an opposite surface of the a surface of the substrate where the multilayer reflective film is formed. The substrate is formed with a material containing quartz ($SiO_2$) as a main component and titanium oxide ($TiO_2$). The multilayer reflective film is formed from a multilayer structure formed by overlaying, on the substrate, a plurality of layers each consisting of a layer whose material is molybdenum (Mo) and a layer whose material is silicon (Si). The protective film is formed on the multilayer reflective film, and has a monolayer structure formed with a material containing either ruthenium (Ru) or silicon (Si), or a laminated structure in which a material containing any one of an oxide, a nitride, or an oxynitride of ruthenium (Ru), or an oxide, a nitride, or an oxynitride of silicon (Si) is additionally laminated on the monolayer structure as an uppermost layer. The absorption film is formed on the protective film, and has a monolayer structure formed with a material containing any one of tantalum (Ta), or an oxide, a nitride, or an oxynitride thereof, or a laminated structure in which a material containing any one of an oxide, a nitride, or an oxynitride of tantalum (Ta), or an oxide, a nitride, or an oxynitride of silicon (Si) is additionally laminated on the monolayer structure as an uppermost layer. The conductive film has a laminated structure or a monolayer structure having a layer of a material containing either indium tin oxide (ITO) or zinc oxide (ZnO).

Preferably, the material of the substrate further contains at least one oxide of manganese (Mn), copper (Cu), cobalt (Co), chromium (Cr), iron (Fe), silver (Ag), nickel (Ni), sulfur (S), selenium (Se), gold (Au), and neodymium (Nd).

Furthermore, the present invention is a reflective mask included a light-shielding frame formed through, in the reflective mask blank, forming a circuit pattern by selectively stripping the absorption film, and selectively stripping the absorption film, the protective film, and the multilayer reflective film at an area surrounding the circuit pattern.

Advantageous Effects of the Invention

With the present invention, it is possible to provide a reflective mask whose reflection is reduced, through having low reflexibility for a conductive film and low transparency for a substrate, against light of EUV and ultraviolet range to near-infrared light range at a light-shielding frame formed on a mask area corresponding to a boundary area of chips that are exposed multiple times on the semiconductor substrate.

By using the reflective mask having such a configuration, it is possible to reduce influence on the dimension of wiring pattern on a semiconductor or the like, and improve yield rate when manufacturing a semiconductor or the like.

BRIEF DESCRIPTION OF THE DRAWINGS

FIG. 2 includes a plan view and a cross sectional view of a reflective mask according to an embodiment of the present invention.

DESCRIPTION OF EMBODIMENTS

Figure 1:
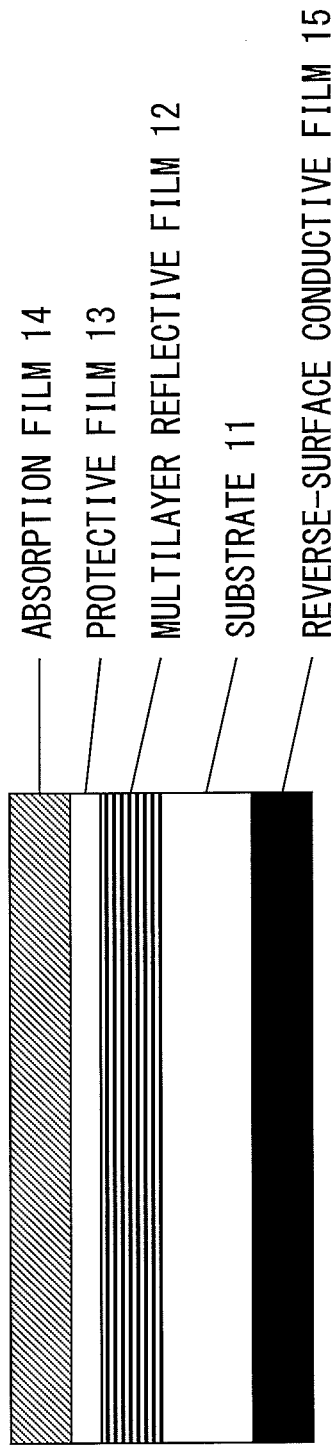
FIG. 1 is a cross sectional view of a reflective mask blank according to an embodiment of the present invention.

A reflective mask blank according to the present invention includes, for example, a substrate, a multilayer reflective film formed on the substrate and configured to reflect exposure light, a protective film formed on the multilayer reflective film and configured to protect the multilayer reflective film, an absorption film formed on the protective film and configured to absorb exposure light, and a conductive film formed on a surface of the substrate opposite to the multilayer reflective film.

A reflective mask can be created by forming a desired pattern on the reflective mask blank having such configuration. In particular, the reflective mask blank can be suitably applied to a reflective mask used for lithography that uses light having a wavelength of 5 nm to 15 nm as exposure light.

The substrate is formed from quartz ($SiO_2$), or a material containing quartz as a main component, and titanium oxide ($TiO_2$) or carbon (C) as a sub component. Here, a main component refers to one whose weight ratio is larger than at least 50%. As the sub component, an oxide of manganese (Mn), copper (Cu), cobalt (Co), chromium (Cr), iron (Fe), silver (Ag), nickel (Ni), sulfur (S), selenium (Se), gold (Au), or neodymium (Nd) may be further included. A composition different from that described above can be suitably used for the substrate when reflectance of DUV is equal to or lower than certain value, more specifically, when reflectance of EUV is not higher than 0.1% or not lower than 3 in terms of optical density, and when reflectance of DUV is not higher than 0.3%.

The multilayer reflective film is formed from a multilayer structure formed by overlaying, on the substrate, a plurality of layers each consisting of a layer whose material is molybdenum (Mo) and a layer whose material is silicon (Si). The protective film is formed on the multilayer reflective film with a material containing either ruthenium (Ru) or silicon (Si), and has a monolayer structure or a laminated structure. In the case with the laminated structure, an uppermost layer of the protective film is formed from a material containing any one of an oxide, a nitride, or an oxynitride of ruthenium (Ru), or an oxide, a nitride, or an oxynitride of silicon (Si).

The absorption film is formed on the protective film with a material containing any one of tantalum (Ta), or an oxide, a nitride, or an oxynitride, and has a monolayer structure or a laminated structure. In the case with the laminated structure, an uppermost layer of the absorption film is formed from a material containing any one of an oxide, a nitride, or an oxynitride of tantalum (Ta), or an oxide, a nitride, or an oxynitride of silicon (Si).

The reverse-surface conductive film formed on the opposite surface of the multilayer reflective film of the substrate has a monolayer structure or a laminated structure, and is formed from indium tin oxide (ITO), zinc oxide (ZnO), or an oxide, a nitride, or an oxynitride of a metal of either chromium (Cr) or tantalum (Ta). In particular, in the case with the laminated structure, a layer of the reverse-surface conductive film on the substrate side is formed from a material containing silicon oxide ($SiO_x$), or an oxide, a nitride, or an oxynitride of a metal of either chromium (Cr) or tantalum (Ta).

In the following, embodiments of the present invention will be described with reference to the drawings. Although the embodiments are described using a term "film," it is possible to substitute the "film" with "layer."

First Embodiment

Firstly, a first embodiment of the present invention will be described with reference to FIG. 1. FIG. 1 is a cross sectional view of a reflective mask blank 10 according to the present embodiment. More specifically, the reflective mask blank 10 is a blank for masks used for exposure using EUV light. The wavelength of EUV light is, for example, 13.5 nm. On one surface of a substrate 11, a multilayer reflective film 12, a protective film 13, and an absorption film 14 are formed in this order. The substrate 11 is a substrate containing quartz ($SiO_2$) as a main component, and has a size of 6-inch square and a thickness of 6.35 mm. The substrate 11 may further contain titanium oxide ($TiO_2$). The multilayer reflective film 12 is formed by alternately laminating, using an ion beam sputtering device, 40 pairs of 4.2 nm of molybdenum (Mo) and 2.8 nm of silicon (Si), i.e., a total of 80 layers, such that the uppermost layer is silicon (Si). Next, the protective film 13 is formed by laminating 0.5 nm to 3 nm of ruthenium (Ru) through magnetron sputtering. Next, the absorption film 14 is formed by depositing, by 20 nm to 150 nm through magnetron sputtering, an alloy, consisting of a chemical compound containing silicon (Si) and tantalum (Ta) as a base material, mixed in a nitrogen gas atmosphere, and depositing, on an upper layer thereof by 5 nm to 20 nm through magnetron sputtering, an alloy consisting of a chemical compound containing silicon (Si) and tantalum (Ta) as a base material, mixed in an atmosphere of mixed gas of nitrogen gas and oxygen gas. On the surface of the substrate 11 opposite to the multilayer reflective film 12, a reverse-surface conductive film 15 is formed by laminating indium tin oxide (ITO) by 100 nm through magnetron sputtering.

Next, a reflective exposure mask according to the present embodiment will be described with reference to FIG. 2. FIG. 2 shows a reflective exposure mask 100 (hereinafter, also referred to as a mask 100) created using the reflective mask blank 10 shown in FIG. 1. In FIG. 2, (a) is a plan view of the mask 100 and (b) is a cross sectional view of the mask 100. As shown in (a) and (b) of FIG. 2, the mask 100 has a structure including a circuit pattern A, and a light-shielding frame area B formed outside the area of the circuit pattern A through parts of the absorption film 14, the protective film 13, and the multilayer reflective film 12.

Figure 3:
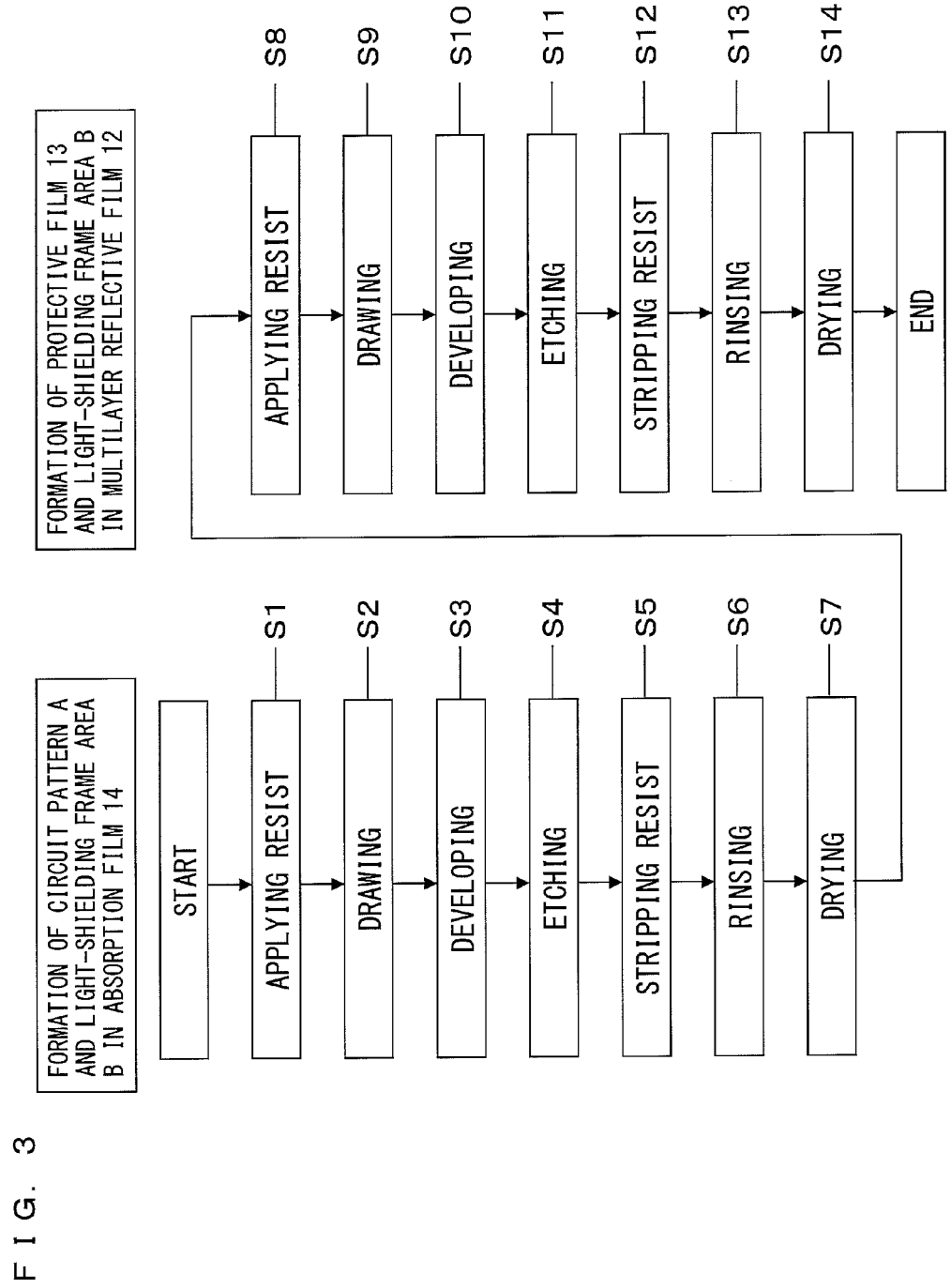
FIG. 3 is a flowchart showing a method for manufacturing a reflective mask according to an embodiment of the present invention.
Figure 4:
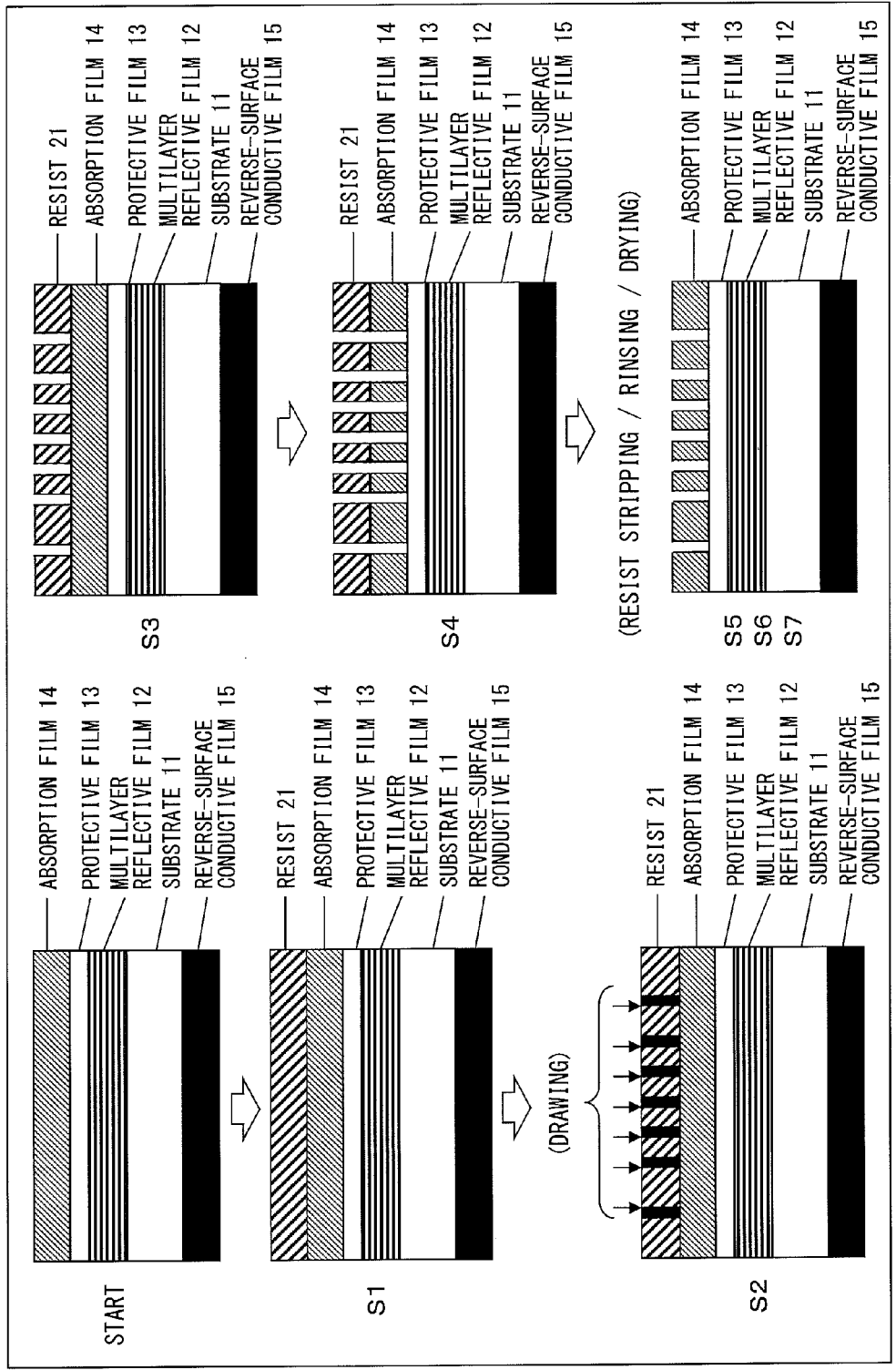
FIG. 4 includes cross sectional views at each step of the method for manufacturing the reflective mask according to an embodiment of the present invention.
Figure 5:
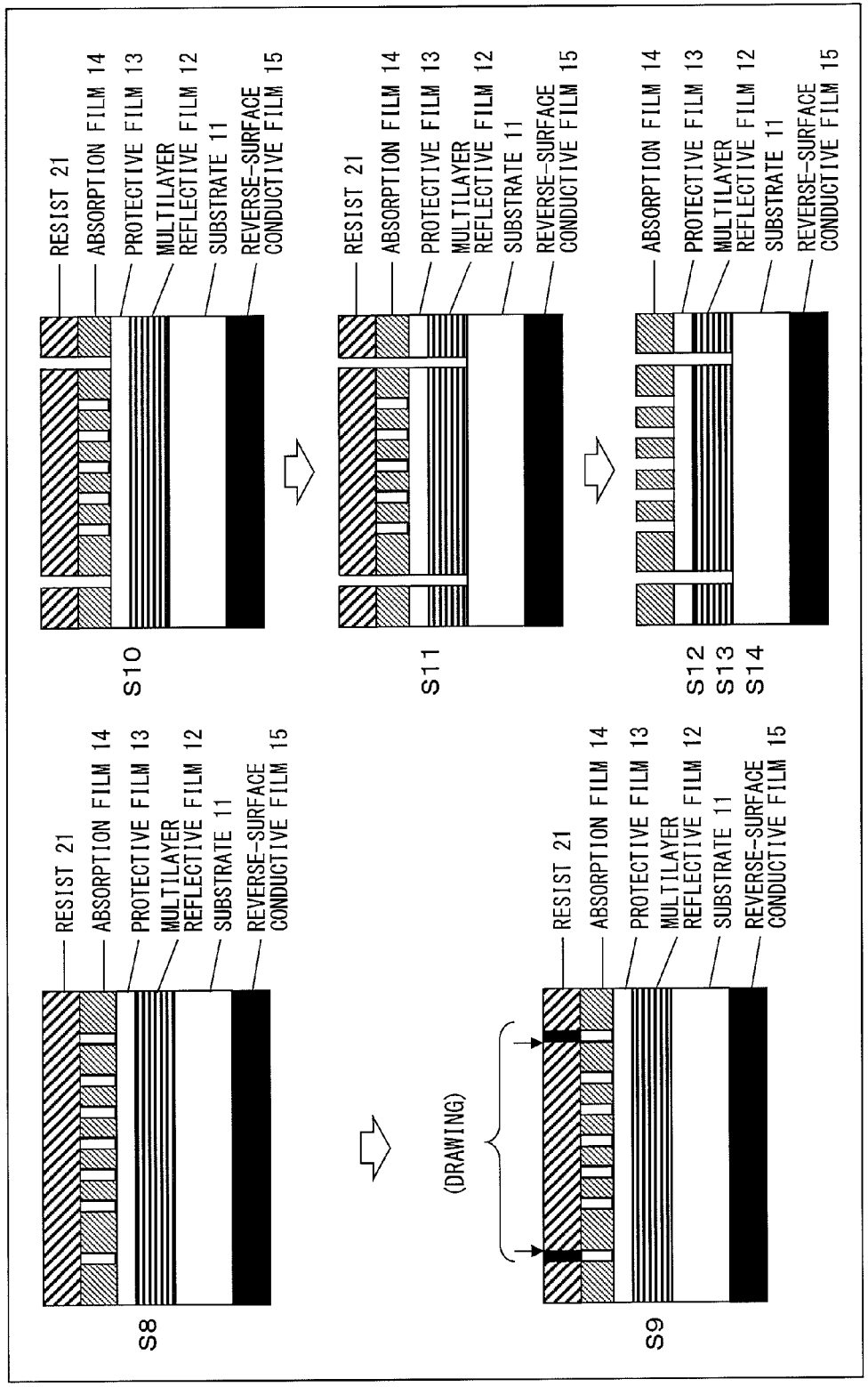
FIG. 5 includes cross sectional views at each step of the method for manufacturing the reflective mask according to an embodiment of the present invention.

Next, the method for manufacturing the mask 100 will be shown in FIG. 3 to FIG. 5. FIG. 3 shows each step of the process, and FIGS. 4 and 5 show cross sectional views of processing states at each step.

First, the reflective mask blank 10 shown in FIG. 1 is prepared, and then a circuit pattern A and a light-shielding frame area B are formed on the absorption film 14. More specifically, a chemically amplified or non-chemically amplified resist 21 that is reactive against electron beam is applied (S1) on the absorption film 14 at a film thickness of 200 nm, and the circuit pattern A and the light-shielding frame area B which are predetermined are drawn (S2) by an electron beam drawing device. Then, developing (S3) is performed using an alkaline solution or the like, a pattern of the formed resist 21 is used as a mask and etching (S4) is performed with gas plasma using a fluorine-based gas or a chlorine-based gas, and unnecessary patterns of the resist 21 are incinerated with oxygen plasma, decomposed with an oxidation chemical such as sulfuric acid and ozone water, or dissolved and stripped (S5) with an organic solvent. Then, if necessary, a rinsing process (S6) using a surfactant, an organic alkaline chemical, or ultrapure water having dissolved therein an acid or basic chemical, ozone gas, or hydrogen gas is performed; and spin drying (S7) utilizing centrifugal force is performed. With the steps described above, the circuit pattern A and the light-shielding frame area B are formed.

Next, the parts of the multilayer reflective film 12 and the protective film 13 of the light-shielding frame area B are formed. First, the resist 21 that is reactive against ultraviolet ray or electron beam is applied (S8) on the absorption film 14. Then, the light-shielding frame area B is exposed or drawn (S9) with electron beam. In a manner similar to (S3) to (S7) described above, developing (S10), etching (S11), resist stripping (S12), rinsing (S13), and drying (S14) are performed to complete the light-shielding frame area B. In the etching step (S11), stripping of the protective film 13 is performed using fluorine-based gas plasma, and stripping of the multilayer reflective film 12 is performed with fluorine-based gas plasma similar to the protective film 13 or with a method of alternately using chlorine gas based plasma to form the light-shielding frame area B. With the steps described above, the reflective mask 100 is completed.

Figure 6:
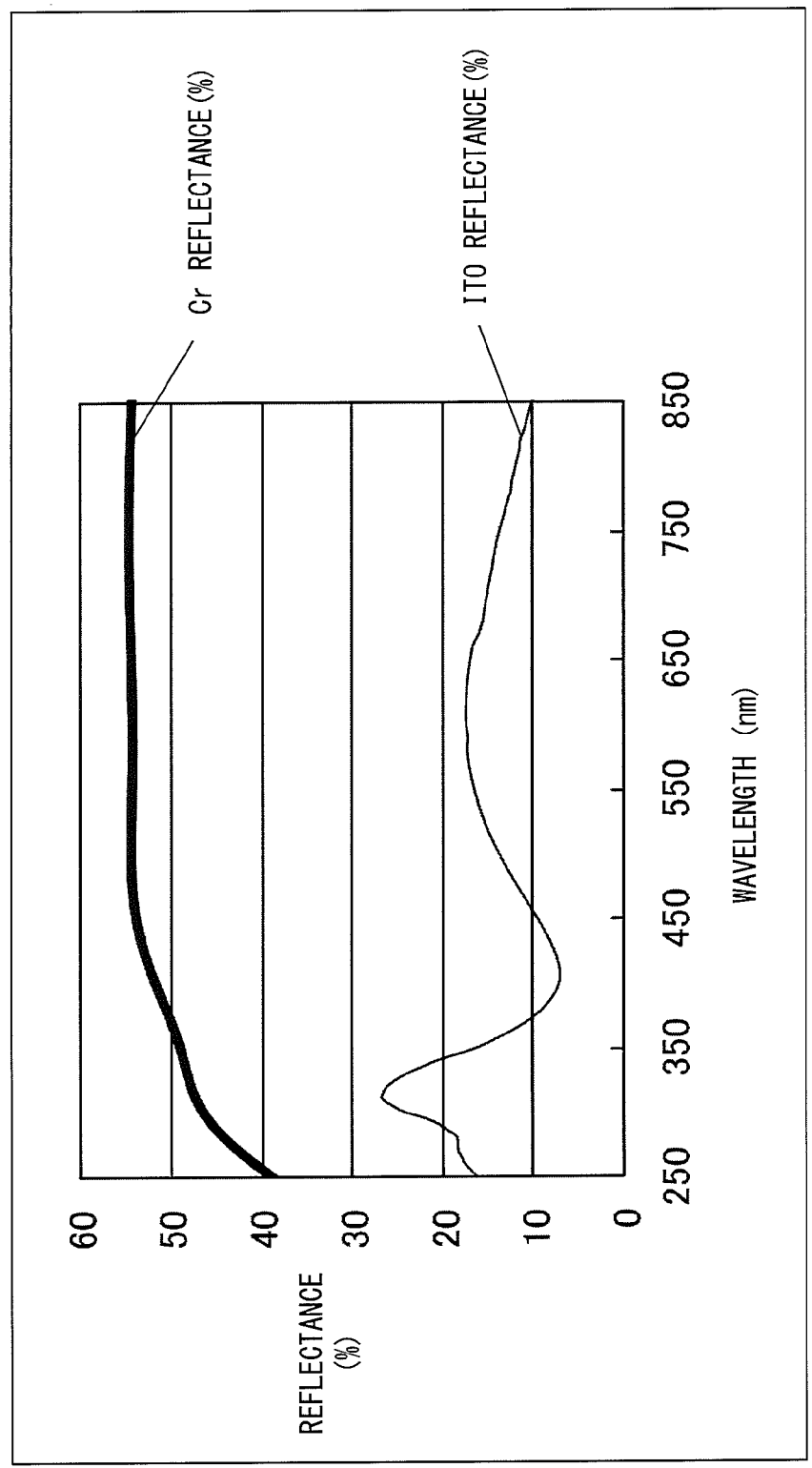
FIG. 6 shows optical characteristics of a reverse-surface conductive film according to a first embodiment of the present invention and a conventional reverse-surface conductive film.

With forming of the light-shielding frame area B alone, it is not possible to remove a light component that once passes through the substrate 11, and is reflected at the reverse-surface conductive film 15 to return again. FIG. 6 shows a comparison of reflectance spectra in a case where chromium (Cr) is used as one example of the material for a conventional reverse-surface conductive film and in a case where ITO is used as the material for the reverse-surface conductive film of the present embodiment. The reflected light used for measurement is light that entered the light-shielding frame area B from the absorption film 14 side, that passed through the substrate 11, that is reflected at the reverse-surface conductive film 15, that passed through the substrate 11 again, and that is emitted from the absorption film 14 side. A reflectometer was used for measuring the reflectance. As a result of measurement, in a wavelength range of 250 nm to 850 nm, ITO of the present embodiment had an average reflectance of 13.5% as compared to an average reflectance of 42.1% for the conventionally used chromium (Cr), and the reflectance was reduced. In addition, sheet resistance of ITO was 90 ohm/$cm^2$ (also described as ohm/ ☐). It should be noted that sheet resistance refers to surface resistivity defined by JIS standard K 6911-1995.

In the present invention, by using a material having improved transparency while ensuring electric conductivity as the reverse-surface conductive film, Out of Band light entering the light-shielding frame area B is not guided to the semiconductor substrate side through reflection, and it is possible to avoid sensitization of the resist applied on the semiconductor substrate. It should be noted that zinc oxide (ZnO) may also be used as the material of the reverse-surface conductive film.

Second Embodiment

A second embodiment of the present invention will be described. A cross sectional view of a reflective mask blank 20 according to the present embodiment is similar to that shown in FIG. 1, and, on the substrate 11, the multilayer reflective film 12, the protective film 13, the absorption film 14, and the reverse-surface conductive film 15 are formed using a magnetron-sputtering method known in the art.

The substrate 11 is formed from a material containing quartz ($SiO_2$) as a main component, and titanium oxide ($TiO_2$) or carbon (C) as a sub component. In addition, as the sub component, at least one oxide of manganese (Mn), copper (Cu), cobalt (Co), chromium (Cr), iron (Fe), silver (Ag), nickel (Ni), sulfur (S), selenium (Se), gold (Au), and neodymium (Nd) is also included.

When a low-thermal-expansion glass or a high purity quartz formed mainly of quartz ($SiO_2$) is used as the substrate 11, the substrate allows light in a range from DUV to near-infrared light to pass through. Therefore, such light is reflected at the reverse-surface conductive film 15 and becomes Out of Band light that unnecessarily sensitizes the resist applied on the semiconductor substrate. The substrate 11 according to the present embodiment and having the above described composition absorbs light at least in the range from DUV to near-infrared light. Therefore, it is possible to suppress reflection of Out of Band light, prevent unnecessary sensitization of the resist, and reduce thermal expansion coefficient.

The specific composition ratio (weight ratio) of the substrate 11 in order to prevent reflectance from becoming high as described above is 84 to 96% for $SiO_2$ and 3 to 15% for $TiO_2$, and at least one oxide of Mn, Cu, Co, Cr, Fe, Ag, Ni, S, Se, Au, and Nd is preferably included. To have the composition ratio of $TiO_2$ in the above described range is particularly preferable, since it become easy to reduce Out of Band light and have a low thermal expansion coefficient.

It is sufficient when the substrate 11 of the present embodiment has wavelength selectivity of being optically opaque against Out of Band light, and it does not matter whether or not the substrate 11 has a color identifiable with the naked eye.

As the substrate 11, it is possible to use a heat-ray absorbing plate glass conforming to JIS R 3208 standard and having absorbency of a specified wavelength. Examples of such heat-ray absorbing plate glass include Sun Yuro (product name) from Asahi Glass Co., Ltd. Since such a substrate absorbs or hinders reflection of EUV and DUV light in addition to heat ray, it becomes possible to lessen the problem related to Out of Band.

The multilayer reflective film 12 is preferably formed by using two targets of molybdenum (Mo) and silicon (Si) prepared in the same deposition apparatus, and alternately depositing thereof by approximately 3 nm and approximately 4 nm, respectively with an ion beam-sputtering method.

The protective film 13 is formed by depositing 2 nm to 3 nm of a Ru alloy.

The absorption film 14 is formed from two layers. The lower layer is formed using a target whose main component is tantalum (Ta), and introducing nitrogen gas and performing deposition by 30 nm to 70 nm to obtain a desired value regarding the formed film stress. The deposition amount of the lower layer is preferably smaller than 70 nm. Deposition thereof by not smaller than 70 nm may generate an optical effect referred to as projection effect described above in the semiconductor pattern. By setting the deposition amount of the lower layer to smaller than 70 nm, the projection effect can be suppressed with further certainty. Generally, the film thickness of the lower layer is preferably a film thickness that enables light-shielding performance not lower than 3 in terms of optical density with respect to an EUV wavelength.

The upper layer of the absorption film 14 is formed using the same target as the lower layer, and introducing oxygen gas and depositing a tantalum oxide ($TaO_x$) or tantalum oxynitride ($TaO_xN_y$) film by 2 nm to 15 nm. As the film thickness of upper layer, a film thickness that can achieve predetermined low reflectance against light source wavelengths of 193 nm, 199 nm, and 257 nm which are generally used in an optical pattern inspection machine is selected.

The reverse-surface conductive film 15 is formed using a target whose main component is chromium (Cr), and introducing nitrogen gas and depositing approximately 10 nm to 100 nm of chromium nitride. Conductivity is preferably not higher than 100 ohm/□ in terms of sheet resistance value. By setting the film thickness of the reverse-surface conductive film 15 to not smaller than 10 nm, the sheet resistance becomes not higher than 100 ohm/□ and preferable conductivity can be obtained.

Next, a reflective exposure mask 200 (hereinafter, also referred to as a mask 200) according to the present embodiment is created using the reflective mask blank 20. Description thereof is provided below. The mask 200 has a structure including a circuit pattern A, and a light-shielding frame area B formed outside the area of the circuit pattern A, through one part of the absorption film 14, the protective film 13, and the multilayer reflective film 12. The plan view and cross sectional view thereof are similar to those shown in FIG. 2.

Manufacturing the mask 200 is performed through steps (S1) to (S14) similar to the first embodiment with respect to the reflective mask blank 20. It should be noted that applying the resist at (S1) and (S8) can be performed by applying, for example, 3000 nm of FEP171 manufactured by Shin-Etsu Chemical Co., Ltd., with a spin coat method. In addition, drawing at (S2) can be performed with, for example, electron beam drawing device EBM6000 manufactured by NuFlare Technology, Inc.

In the present embodiment, by using the substrate 11 that is stained or colored, it is possible to reduce the amount of light that enters the light-shielding frame area B, that passes through the substrate 11 once, that is reflected at the reverse-surface conductive film 15, and that passes through the substrate 11 once again to return. With the present embodiment, unnecessary Out of Band light is not guided to the semiconductor substrate side, and it is possible to avoid sensitization of the resist applied on the semiconductor substrate.

The composition of the substrate 11 is not limited to that described above. Similar advantageous effect can be obtained when reflectance of EUV and DUV is equal to or lower than certain value, more specifically, when reflectance of EUV is not higher than 0.1% or not lower than 3 in terms of optical density, and when reflectance of DUV is not higher than 0.3%. Reflectance of EUV on the substrate can be measured with a reflectometer manufactured by EUV Technology Co., Ltd., and reflectance of DUV on the substrate can be measured with a spectrophotometer U4100 manufactured by Hitachi High-Technologies Corp.

Reflectance of EUV and DUV was measured at each part of the mask 200 manufactured with the method described above. The above described reflectometer and spectrophotometer were used for the measurement. The parts that were measured on the mask 200 are shown in FIG. 7.

Figure 7:
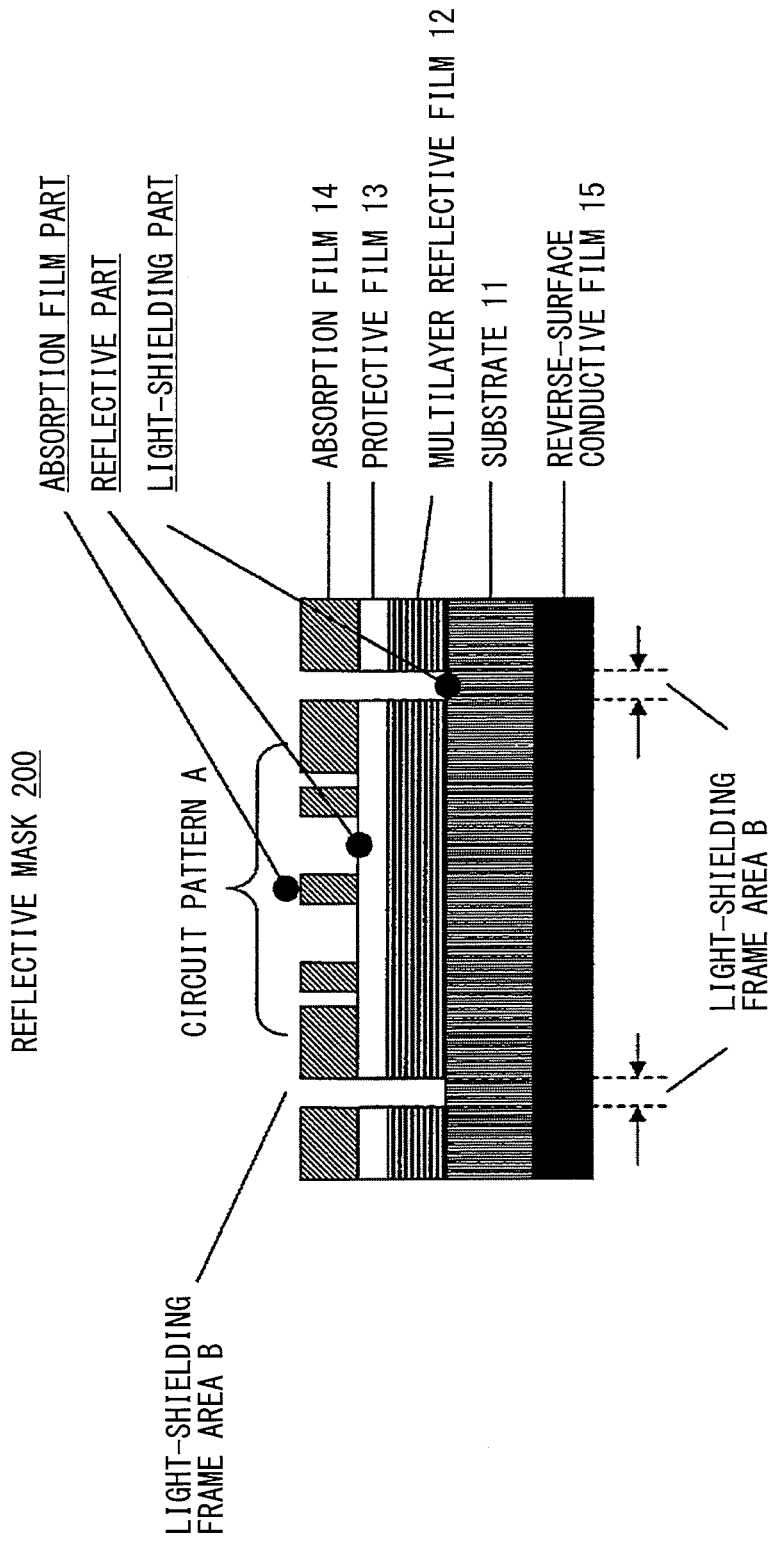
FIG. 7 represents points where reflectance is measured for a reflective mask according to a second embodiment of the present invention.

Table 1 shows measurement results of EUV reflectance and DUV reflectance each at an absorption film part, a reflective part, and a light-shielding part shown in FIG. 7.

TABLE 1

| | Measurement results | | |
|---|---|---|---|
| | Wavelength | | |
| | 13.5 nm | 193 nm | 257 nm |
| Absorption film part | 1.5% | 20.4% | 5.9% |
| Reflective part | 61.7% | 47.6% | 52.7% |
| Light-shielding part | 0% | 0% | 0% |

Figure 8:
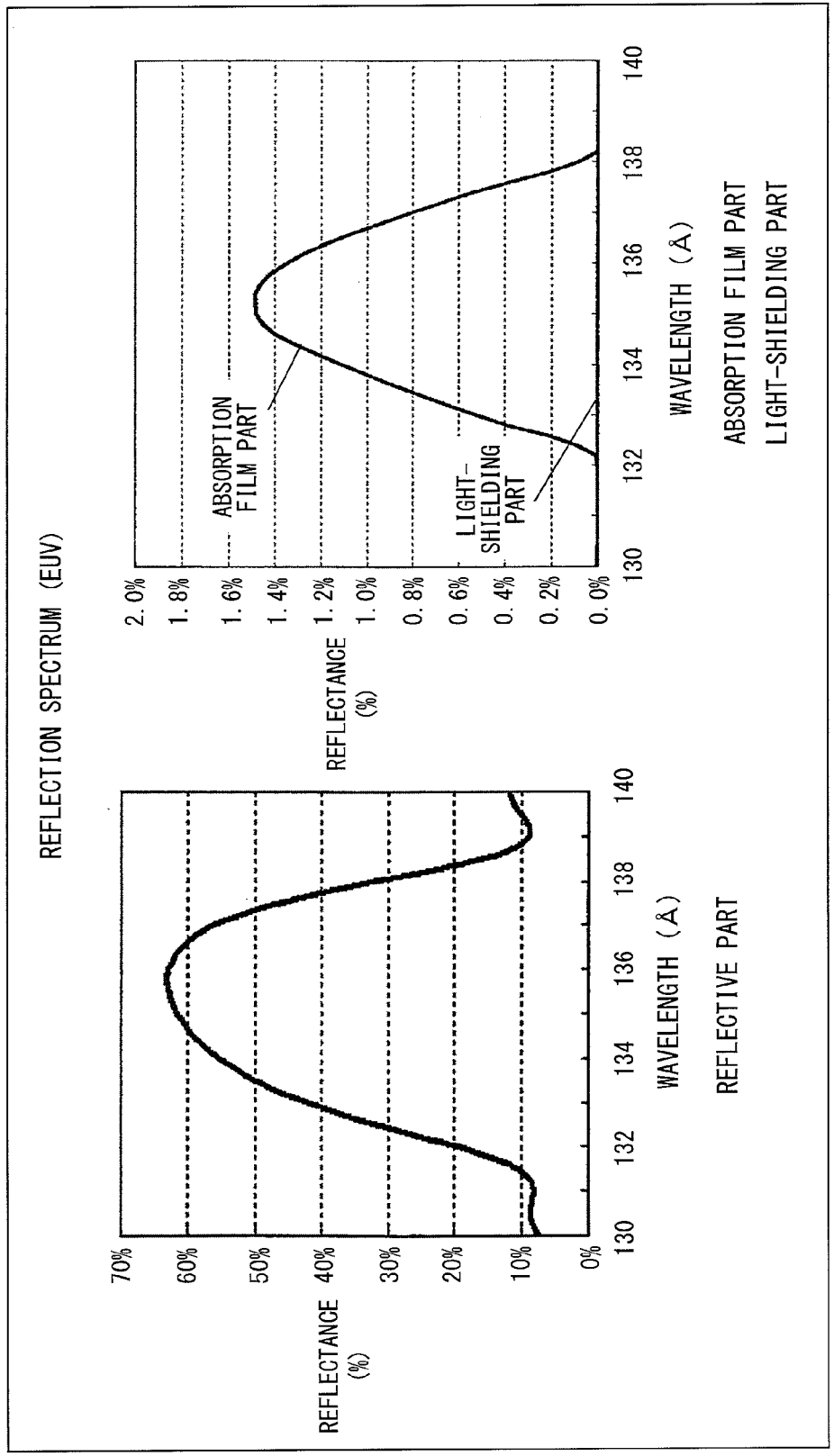
FIG. 8 shows a result of measuring reflectance of the reflective mask according to the second embodiment of the present invention.

In addition, FIG. 8 shows reflection spectra in the EUV range of wavelength from 13 nm to 14 nm (130 angstrom to 140 angstrom) at each of the measuring parts. Reflectance of EUV light at a wavelength of 13.5 nm at the absorption film part, the reflective part, and the light-shielding part were 61.7%, 1.48%, and 0%, respectively. Here, the reflectance at the light-shielding part was 0%, and it was confirmed that the reflectance was unmeasurably small.

Figure 9:
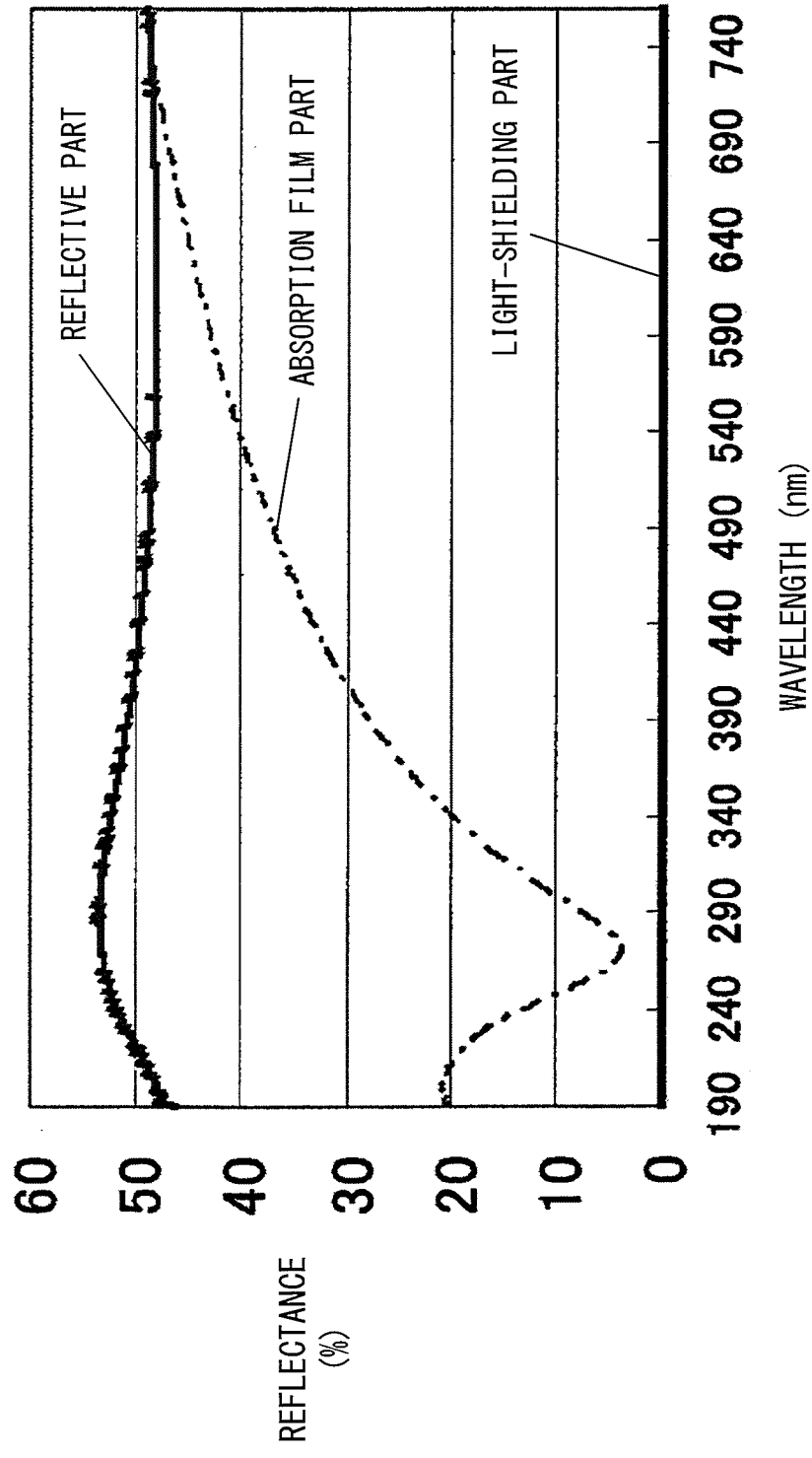
FIG. 9 shows the result of measuring reflectance of the reflective mask according to the second embodiment of the present invention.

FIG. 9 shows reflection spectra in a range of deep ultra violet (DUV), visible (BIS), and near infrared ray (NIR) in wavelength from 190 nm 760 nm at each of the measuring parts. At the absorption film part, the reflective part, and the light-shielding part; reflectance of light at a wavelength of 199 nm was 20.4%, 47.6%, and 0%, respectively, and reflectance of light at a wavelength of 257 nm was 5.9%, 52.7%, and 0%, respectively. In both wavelengths, the reflectance at the light-shielding part was 0%, and it was confirmed that the reflectance was unmeasurably small.

The present invention can be utilized in micro fabrication and semiconductor fabrication in which a pattern is formed through exposure.

The present invention is not limit solely to the embodiments described above, and modifications can be made as long as they do not depart from the spirit of the present invention. Various inventions can be envisioned by appropriately combining the items shown in the specification. For example, sensitization of the resist applied on the semiconductor substrate can be avoided with further certainty by combining the reverse-surface conductive film of the first embodiment and the substrate of the second embodiment.

INDUSTRIAL APPLICABILITY

The present invention is useful for a mask for reflection-type exposure and the like used in micro fabrication and semiconductor fabrication in which a pattern is formed through exposure.

DESCRIPTION OF THE REFERENCE CHARACTERS 10, 20 reflective mask blank
11 substrate
12 multilayer reflective film
13 protective film
14 absorption film
15 reverse-surface conductive film
21 resist (pattern)
100, 200 reflective mask

The invention claimed is:

1. A reflective mask blank comprising:
a substrate;
a multilayer reflective film formed on the substrate and configured to reflect exposure light;
a protective film formed on the multilayer reflective film and configured to protect the multilayer reflective film;
an absorption film formed on the protective film and configured to absorb exposure light; and
a conductive film formed on an opposite surface of the a surface of the substrate where the multilayer reflective film is formed, wherein
the substrate is formed with a material containing quartz ($SiO_2$) as a main component and titanium oxide ($TiO_2$),
the multilayer reflective film is formed from a multilayer structure formed by overlaying, on the substrate, a plurality of layers each consisting of a layer whose material is molybdenum (Mo) and a layer whose material is silicon (Si),
the protective film is formed on the multilayer reflective film, and has a monolayer structure formed with a material containing either ruthenium (Ru) or silicon (Si), or a laminated structure in which a material containing any one of an oxide, a nitride, or an oxynitride of ruthenium (Ru), or an oxide, a nitride, or an oxynitride of silicon (Si) is additionally laminated on the monolayer structure as an uppermost layer,
the absorption film is formed on the protective film, and has a monolayer structure formed with a material containing any one of tantalum (Ta), or an oxide, a nitride, or an oxynitride thereof, or a laminated structure in which a material containing any one of an oxide, a nitride, or an oxynitride of tantalum (Ta), or an oxide, a nitride, or an oxynitride of silicon (Si) is additionally laminated on the monolayer structure as an uppermost layer,
the conductive film has a laminated structure or a monolayer structure having a layer of a material containing indium tin oxide (ITO), and
an average reflectance in a wavelength range of 250 nm to 850 nm of reflected light is 13.5%, the reflected light being light that has entered from the absorption film, that has passed through the substrate, that has been reflected at the conductive film, that has passed through the substrate again, and that is emitted from the absorption film.

2. The reflective mask blank according to claim 1, wherein the material of the substrate further contains at least one oxide of manganese (Mn), copper (Cu), cobalt (Co), chromium (Cr), iron (Fe), silver (Ag), nickel (Ni), sulfur (S), selenium (Se), gold (Au), and neodymium (Nd).

3. A reflective mask comprising a light-shielding frame formed through, in the reflective mask blank according to claim 1, forming a circuit pattern by selectively stripping the absorption film, and selectively stripping the absorption film, the protective film, and the multilayer reflective film at an area surrounding the circuit pattern.

* * * * *

UNITED STATES PATENT AND TRADEMARK OFFICE
CERTIFICATE OF CORRECTION

Page 1 of 1

PATENT NO.        : 9,442,364 B2
APPLICATION NO.   : 14/221994
DATED             : September 13, 2016
INVENTOR(S)       : Yutaka Kodera et al.

It is certified that error appears in the above-identified patent and that said Letters Patent is hereby corrected as shown below:

In the Claims,

Column 10, Line 13, Claim 1:

After "surface of" delete "the", therefor.

Signed and Sealed this
Fifteenth Day of November, 2016

Michelle K. Lee
*Director of the United States Patent and Trademark Office*